US010276636B2

(12) United States Patent
Kim

(10) Patent No.: US 10,276,636 B2
(45) Date of Patent: Apr. 30, 2019

(54) ELECTRONIC DEVICE AND METHOD FOR FABRICATING THE SAME

(71) Applicant: SK hynix Inc., Icheon-Si (KR)

(72) Inventor: In-Hoe Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 232 days.

(21) Appl. No.: 15/166,159

(22) Filed: May 26, 2016

(65) Prior Publication Data

US 2017/0141159 A1 May 18, 2017

(30) Foreign Application Priority Data

Nov. 12, 2015 (KR) .................. 10-2015-0158809

(51) Int. Cl.

| H01L 27/24 | (2006.01) |
| H01L 45/00 | (2006.01) |
| G06F 3/06 | (2006.01) |
| G06F 12/0802 | (2016.01) |
| G06F 13/40 | (2006.01) |
| H01L 27/22 | (2006.01) |

(Continued)

(52) U.S. Cl.
CPC .......... *H01L 27/2436* (2013.01); *G06F 3/061* (2013.01); *G06F 3/0656* (2013.01); *G06F 3/0679* (2013.01); *G06F 12/0802* (2013.01); *G06F 13/4068* (2013.01); *H01L 27/228* (2013.01); *H01L 43/02* (2013.01); *H01L 43/08* (2013.01); *H01L 43/10* (2013.01); *H01L 45/08* (2013.01); *H01L 45/085* (2013.01); *H01L 45/1233* (2013.01); *H01L 45/1253* (2013.01); *H01L 45/1266* (2013.01); *H01L 45/145* (2013.01); *G06F 2212/2024* (2013.01); *G06F 2212/60* (2013.01)

(58) Field of Classification Search
CPC . H01L 45/1233; H01L 45/1253; H01L 43/02; H01L 43/08
See application file for complete search history.

(56) References Cited

U.S. PATENT DOCUMENTS

| 7,498,601 B2 * | 3/2009 | Hayakawa .......... H01L 27/2436 257/2 |
| 8,981,440 B2 * | 3/2015 | Nakao ............... H01L 21/76849 257/295 |

(Continued)

FOREIGN PATENT DOCUMENTS

| KR | 10-0588664 B | 6/2006 |
| KR | 10-2008-0114057 A | 12/2008 |

*Primary Examiner* — Allison Bernstein
(74) *Attorney, Agent, or Firm* — Perkins Coie LLP

(57) ABSTRACT

Implementations of the disclosed technology provide an electronic device including a semiconductor memory and a method for fabricating the same, in which processes are easily performed and the characteristics of a variable resistance element are improved. An electronic device according to an implementation of the disclosed technology is an electronic device including a semiconductor memory, wherein the semiconductor memory includes: a substrate; a conductive contact plug formed over the first conductive layer and including a stack of a conductive low-resistance structure and a conductive planarizing layer; and a variable resistance pattern coupled to the contact plug, wherein the low-resistance structure comprises a diffusion barrier layer, a low-resistance material layer and a gap-fill layer.

18 Claims, 12 Drawing Sheets

(51) Int. Cl.
*H01L 43/02* (2006.01)
*H01L 43/08* (2006.01)
*H01L 43/10* (2006.01)

(56) References Cited

U.S. PATENT DOCUMENTS

| | | | |
|---|---|---|---|
| 9,178,144 B1* | 11/2015 | Sung | H01L 45/1253 |
| 2014/0258626 A1* | 9/2014 | Kang | H01L 45/1253 |
| | | | 711/125 |
| 2015/0028423 A1 | 1/2015 | Park et al. | |
| 2016/0190207 A1* | 6/2016 | Nam | H01L 43/02 |
| | | | 257/421 |

* cited by examiner

ELECTRONIC DEVICE AND METHOD FOR FABRICATING THE SAME

CROSS-REFERENCE TO RELATED APPLICATIONS

The present application claims priority of Korean Patent Application No. 10-2015-0158809, entitled "ELECTRONIC DEVICE AND METHOD FOR FABRICATING THE SAME" and filed on Nov. 12, 2015, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which processes for fabricating the electronic device can be easily performed and the characteristics of a variable resistance element can be improved.

In an implementation, a semiconductor device may include: a first conductive layer; a conductive contact plug formed on the first conductive layer and including a stack of a conductive low-resistance structure and a conductive planarizing layer; and a second conductive layer coming in contact with the contact plug, wherein the low-resistance structure includes a diffusion barrier layer, a low-resistance material layer, and a gap-fill layer.

Implementations of the above semiconductor device may include one or more the following.

The diffusion barrier layer and the low-resistance material layer are U-shaped liner-type layers. The diffusion barrier layer comprises a tantalum layer or a tantalum nitride layer. The low-resistance material layer comprises a metal material selected from copper, tungsten, silver, platinum and/or gold. The low-resistance material layer has an electrical conductivity of at least 9 Msm$^{-1}$. The gap-fill layer comprises a titanium nitride layer or a tantalum layer. The planarizing layer comprises a tantalum layer. The semiconductor device further comprising an interlayer insulating layer formed over the first conductive layer, wherein the contact plug is formed through the interlayer insulating layer. The semiconductor device further comprising a spacer layer formed over a side surface of the low-resistance structure.

In an implementation, an electronic device including a semiconductor memory may be provided wherein the semiconductor memory includes: a substrate; a conductive contact plug formed on the first conductive layer and including a stack of a conductive low-resistance structure and a conductive planarizing layer; and a variable resistance pattern connected to the contact plug, wherein the low-resistance structure includes a diffusion barrier layer, a low-resistance material layer, and a gap-fill layer.

Implementations of the above electronic device may include one or more the following.

The diffusion barrier layer and the low-resistance material layer are U-shaped liner-type layers. The diffusion barrier layer comprises a tantalum layer or a tantalum nitride layer. The low-resistance material layer comprises a metal material selected from copper, tungsten, silver, platinum and/or gold. The low-resistance material layer has an electrical conductivity of at least 9 Msm$^{-1}$. The gap-fill layer comprises a titanium nitride layer or a tantalum layer. The planarizing layer comprises a tantalum layer. The electronic device further comprising an interlayer insulating layer formed over the substrate, wherein the contact plug is formed through the interlayer insulating layer. The electronic device further comprising a spacer layer formed over a side surface of the low-resistance structure. The variable resistance pattern comprises two magnetic layers and a tunnel barrier layer sandwiched between the magnetic layers. The variable resistance pattern comprises a stack of first and second metal oxide layers having different oxygen contents.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory may include: forming on a substrate a bottom electrode contact including a stack of a conductive low-resistance structure and a conductive planarizing layer; forming a variable resistance pattern coming in contact with the bottom electrode contact; forming a top electrode contact on the variable resistance pattern; and forming a conductive line on the top electrode contact.

Implementations of the above method may include one or more the following.

The low-resistance structure comprises a barrier layer, a low-resistance material layer and a gap-fill layer. The barrier layer and the low-resistance material layer are U-shaped liner-type layers. The diffusion barrier layer comprises a tantalum layer or a tantalum nitride layer. The low-resistance material layer comprises a metal material selected from copper, tungsten, silver, platinum and/or gold. The low-resistance material layer has an electrical conductivity of at least $9 \times 10^6$ siemens/meter or 9 Msm$^{-1}$. The gap-fill layer comprises a titanium nitride layer or a tantalum layer. The planarizing layer comprises a tantalum layer.

These and other aspects, implementations and associated advantages are described in greater detail in the drawings, the description and the claims.

DETAILED DESCRIPTION

Figure 1:
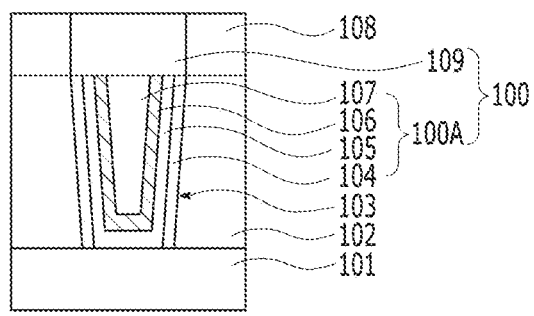
FIG. 1 is a cross-sectional view illustrating a semiconductor device according to a first implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a semiconductor device according to a first implementation of the disclosed technology.

As shown in FIG. 1, the semiconductor device according to the first implementation of the disclosed technology may include: a first interlayer insulating layer 102 and second interlayer insulating layer 108 formed on a first conductive layer 101; and a conductive contact plug 100 formed through the first interlayer insulating layer 102 and the second interlayer insulating layer 108 so as to come in contact with the first conductive layer 101. In particular, the contact plug 100 may include a conductive low-resistance structure 100A filling a contact hole 103 formed through the first interlayer insulating layer 102, and a conductive planarizing layer 109 formed through the second interlayer insulating layer 108 so as to come in contact with the conductive low-resistance structure 100A. A low-resistance material exhibits a low resistance value which can be characterized by its electrical conductivity. For some implementations, a material with an electrical conductivity at or higher than $9\times10^6$ siemens/meter or 9 Msm$^{-1}$ can be considered "low resistance" for such implementations.

The first conductive layer 101 may include a semiconductor substrate. In addition, the semiconductor substrate may be a wafer having formed therein a structure such as a buried gate. Herein, the surface of the first conductive layer 101, which comes in contact with the conductive contact plug 100, may provide a gate layer.

The first interlayer insulating layer 102 and the second interlayer insulating layer 108 may include a dielectric material, for example, oxide, nitride or oxynitride. This implementation illustrates the first and second interlayer insulating layers 102 and 108, but is not limited thereto, and an air gap or the like may be provided instead of the first and second interlayer insulating layers 102 and 108.

The low-resistance structure 100A may include: a spacer layer 104 formed on both sidewalls of the contact hole 103; a liner-type barrier layer 105 formed on the spacer layer along the sidewall and bottom of the contact hole 103; a liner-type low-resistance material layer 106 formed on the barrier layer 105; and a gap-fill layer 107 formed on the low-resistance material layer 106 to fill up the remaining portion of the contact hole 103. In implementations, the barrier layer 105 and the low-resistance material layer 106 may be U-shaped liner-type layers. In addition, the gap-fill layer 107 may have a shape surrounded by the U-shaped low-resistance material layer 106.

The spacer layer 104 may include a dielectric material, for example, an oxide or nitride. The spacer layer 104 may optionally be formed or may be omitted. The barrier layer 105 serves as a diffusion barrier for the low-resistance material layer 106, and may include an electrically conductive material. The barrier layer 105 may include a low-resistance conductive material or compound, for example, tantalum (Ta) or tantalum nitride (TaN), which has the property of preventing the penetration of metal ions. As such, the barrier layer 105 may serve as a diffusion barrier layer. The low-resistance material layer 106 serves to reduce the resistance of the contact plug, and may be a liner-type layer. The low-resistance material layer 106 may include one or more low-resistance metal materials, for example, copper (Cu), tungsten (W), silver (Ag), platinum (Pt) and/or gold (Au). The gap-fill layer 107 may include a material that minimizes dishing in a polishing process for planarization, etc. For example, the gap-fill layer 107 may include a metal material such as titanium nitride (TiN) or tantalum (Ta).

The planarizing layer 109 may serve not only as a diffusion barrier layer that prevents metal ions in the low-resistance material layer 106 from diffusing to an overlying layer that is above the planarizing layer 109, but also to planarize the surface of the contact plug 100 to thereby prevent the characteristics of the overlying structure from being deteriorated due to surface roughness. The planarizing layer 109 for this purpose may include a metal material such as tantalum (Ta).

As described above, the low-resistance structure 100A according to this implementation includes not only the low-resistance material layer 106 for reducing the resistance of the contact plug 100, but also the liner-type gap-fill layer 107 formed of a low-resistance material such as copper (Cu), and thus it can prevent dishing or heat-induced migration in a subsequent planarization process and, at the same time, ensure low resistance. In addition, the planarizing layer 109 can prevent metal ions in the low-resistance structure 100A from diffusing to the overlying structure (not shown) and, at the same time, planarize the surface of the contact plug 100 to thereby prevent the characteristics of the overlying structure from being deteriorated due to surface roughness.

Figure 2:
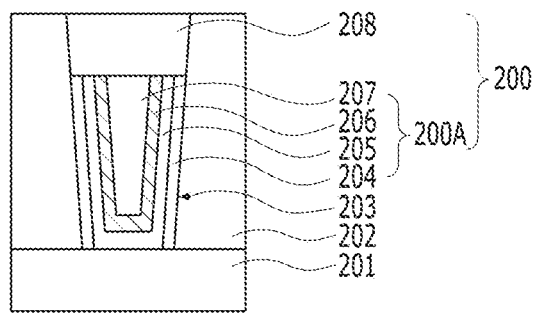
FIG. 2 is a cross-sectional view illustrating a semiconductor device according to a second implementation of the disclosed technology.

FIG. 2 is a cross-sectional view illustrating a semiconductor device according to a second implementation of the disclosed technology.

As shown in FIG. 2, the semiconductor device according to the second implementation of the disclosed technology may include: an interlayer insulating layer 202 formed on a first conductive layer 201 having a certain structure formed therein; and a contact plug 200 formed through the interlayer insulating layer 202 so as to come in contact with the first conductive layer 201. In particular, the contact plug 200 may include: a conductive low-resistance structure 200A filling a portion of a contact hole 203 formed through the interlayer insulating layer 202; and a conductive planarizing layer 208 filling the remaining portion of the contact hole 203 so as to come in contact with the low-resistance structure 200A.

The first conductive layer 201 may include a semiconductor substrate. In addition, the semiconductor substrate may be, for example, a wafer having formed therein a structure such as a buried gate. Herein, the surface of the first conductive layer 201, which comes in contact with the conductive contact plug 200, may provide a gate layer.

The interlayer insulating layer 202 may include a dielectric material, for example, oxide, nitride or oxynitride. This implementation illustrates the interlayer insulating layer 202, but is not limited thereto, and an air gap or the like may be provided instead of the interlayer insulating layer 202.

The low-resistance structure 200A may include: a spacer layer 204 formed on both sidewalls of the contact hole 203; a liner-type barrier layer 205 formed on the spacer layer 204 along the sidewall and bottom of the contact hole 203; a liner-type low-resistance material layer 206 formed on the barrier layer 205; and a gap-fill layer 207 formed on the low-resistance material layer 206 and filling the remaining portion of the contact hole 203. Namely, the barrier layer 205 and the low-resistance material layer 206 may be U-shaped liner-type layers. In addition, the gap-fill layer 207 may have a shape surrounded by the U-shaped low-resistance material layer 206.

The spacer layer 104 may include a dielectric material, for example, oxide or nitride. The spacer layer 204 may optionally be formed or may be omitted. The barrier layer 205 serves as a diffusion barrier for the low-resistance material layer 206, and may include an electrically conductive material. The barrier layer 205 may include a low-resistance conductive material or compound, for example, tantalum (Ta) or tantalum nitride (TaN), which has the property of preventing the penetration of metal ions. In other words, the barrier layer 205 may serve as a diffusion barrier layer. The low-resistance material layer 206 serves to reduce the resistance of the contact plug, and may be a liner-type layer. The low-resistance material layer 206 may include one or more low-resistance metal materials, for example, copper (Cu), tungsten (W), silver (Ag), platinum (Pt) and/or gold (Au). The gap-fill layer 207 may include a material that minimizes dishing in a polishing process for planarization, etc. For example, the gap-fill layer 207 may include a metal material such as titanium nitride (TiN) or tantalum (Ta).

The planarizing layer 208 may serve not only as a diffusion barrier layer that prevents metal ions in the low-resistance material layer 206 from diffusing to an overlying layer that is above the planarizing layer 208, but also to planarize the surface of the contact plug 200 to thereby prevent the characteristics of the overlying structure from being deteriorated due to surface roughness. The planarizing layer 208 for this purpose may include a metal material, for example, tantalum (Ta).

As described above, the low-resistance structure 200A according to this implementation includes not only the low-resistance material layer 206 for reducing the resistance of the contact plug 200, but also the liner-type gap-fill layer 207 formed of a low-resistance material such as copper (Cu), and thus it can prevent dishing or heat-induced migration in a subsequent planarization process and, at the same time, ensure low resistance. In addition, the planarizing layer 208 can prevent metal ions in the low-resistance structure 200A from diffusing to the overlying structure (not shown) and, at the same time, planarize the surface of the contact plug 200 to thereby prevent the characteristics of the overlying structure from being deteriorated due to surface roughness.

FIGS. 3A to 3G are cross-sectional views illustrating processes of a method for fabricating the semiconductor device according to the first implementation of the disclosed technology.

Figure 3A:
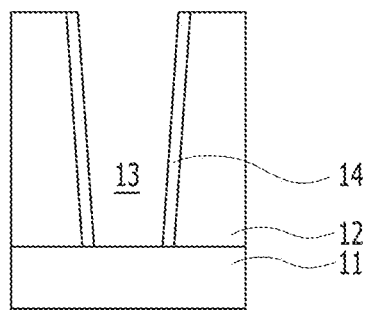
FIGS. 3A to 3G are cross-sectional views illustrating processes of a method for fabricating the semiconductor device according to the first implementation of the disclosed technology.

As shown in FIG. 3A, a first interlayer insulating layer 12 may be formed on a first conductive layer 11. The first conductive layer 11 may include a semiconductor substrate. The first interlayer insulating layer 12 may include a material having etch selectivity with respect to the first conductive layer 11. The first interlayer insulating layer 12 may include a dielectric material, for example, oxide, nitride or oxynitride.

Then, a contact hole 13 may be formed through the first interlayer insulating layer 12 so as to expose the surface of the first conductive layer 11.

Then, a spacer layer 14 may be formed on both sidewalls of the contact hole 13. The spacer layer 14 may be formed through a series of processes which include forming a dielectric material layer along the entire surface including the contact hole 13 and then etching the dielectric material layer so as to remain only on both sidewalls of the contact hole 13. The spacer layer 14 serves to insulate a contact plug to be formed by a subsequent process, and may be omitted if necessary. The spacer layer 14 may include a material having etch selectivity with respect to the first interlayer insulating layer 12 and the contact plug to be formed by a subsequent process. The spacer layer 14 may include a dielectric material, for example, oxide or nitride.

Figure 3B:
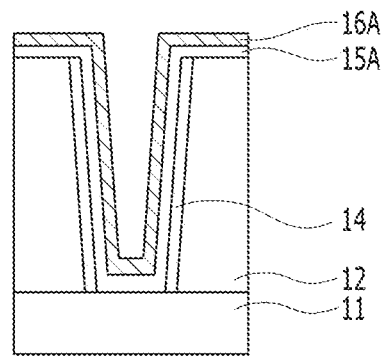

As shown in FIG. 3B, a barrier layer 15A may be formed on the spacer layer 14 along the sidewall and bottom of the contact hole 13. The barrier layer 15A may serve as a barrier to prevent metal ions in the low-resistance material layer 16A from diffusing to the outside. The barrier layer 15A may include an electrically conductive material or compound, for example, tantalum (Ta) or tantalum nitride (TaN), which has the property of preventing the penetration of metal ions.

Next, a low-resistance material layer 16A may be formed on the barrier layer 15A. The low-resistance material layer 16A may be formed as a liner-type layer in order to prevent deterioration (e.g., dishing or deterioration) from occurring in a subsequent planarization process or heat treatment. The low-resistance material layer 16A may include a low-resistance metal material, for example, copper (Cu), tungsten (W), silver (Ag), platinum (Pt) or gold (Au).

Figure 3C:
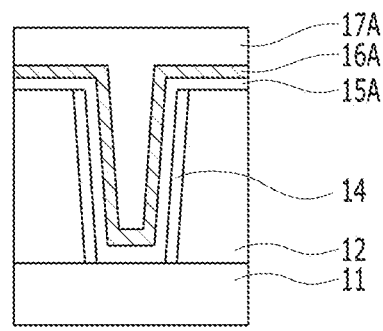

As shown in FIG. 3C, a gap-fill layer 17A may be formed on the low-resistance material layer 16A. The gap-fill layer 17A may include a material that minimizes dishing in a polishing process for planarization, etc. The gap-fill layer 17A may include a metal material, for example, titanium nitride (TiN) or tantalum (Ta). The gap-fill layer 17A may be formed to a thickness that sufficiently fills the contact hole 13.

Figure 3D:
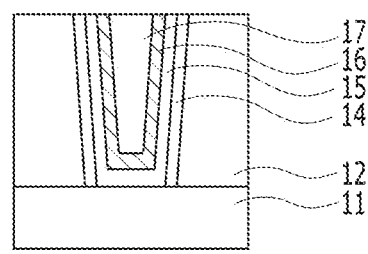

As shown in FIG. 3D, the gap-fill layer 17A (see FIG. 3C), the low-resistance material layer 16A and the barrier layer 15A may be etched until the first interlayer insulating layer 12 is exposed. Etching of the gap-fill layer 17A (see FIG. 3C), the low-resistance material layer 16A and the barrier layer 15A may be performed by a planarization process such as a chemical mechanical polishing process. The planarization process may be performed using a slurry capable of etching a metal. Particularly, because the low-resistance material layer 16A is formed as a liner-type layer so that its contact area with the slurry is not large, dishing of the low-resistance structure 10A in the polishing process can be prevented.

Through the planarization process, the low-resistance structure 10A filling the inside of the contact hole 13 may be formed. The low-resistance structure 10A may include the spacer layer 14, the barrier layer 15, the low-resistance material layer 16 and the gap-fill layer 17.

Figure 3E:
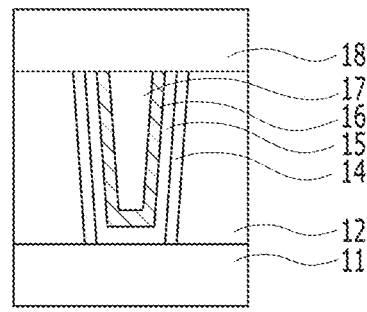

As shown in FIG. 3E, a second interlayer insulating layer 18 may be formed on the first interlayer insulating layer 12 including the low-resistance structure 10A. The second interlayer insulating layer 18 may include a material having etch selectivity with respect to the first interlayer insulating layer 12. For example, the second interlayer insulating layer 18 may include a dielectric material such as oxide, nitride or oxynitride. For example, if the first interlayer insulating layer 12 includes oxide, the second interlayer insulating layer 18 may include nitride. In this case, the first interlayer insulating layer 12 is not damaged in a subsequent process of etching the second interlayer insulating layer 18 to form a planarizing layer, even when it is exposed.

Figure 3F:
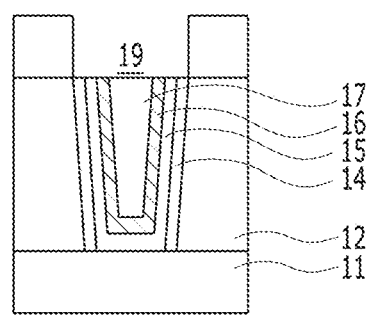

As shown in FIG. 3F, the second interlayer insulating layer 18 may be etched to form an open portion 19. The open portion 19 serves to define a planarizing layer region to be formed in a subsequent process. The line width of the open portion 19 can be controlled such that the surface of the low-resistance structure 10A is completely exposed.

Figure 3G:
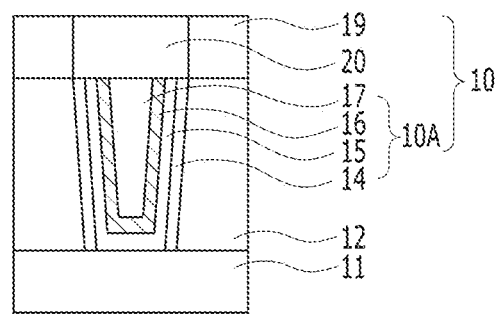

As shown in FIG. 3G, a conductive planarizing layer 20 may be filled in the open portion 19 to thereby form a contact plug 10 composed of the low-resistance structure 10A and the planarizing layer 20. The planarizing layer 20 may serve not only as a barrier layer that prevents metal ions in the low-resistance material layer 17 from diffusing to the overlying layer, but also to planarize the surface of the contact plug 10 to thereby prevent the characteristics of the overlying structure from being deteriorated due to surface roughness. The planarizing layer 20 may include a metal material, for example, tantalum (Ta).

FIGS. 4A to 4F are cross-sectional views illustrating processes of a method for fabricating the semiconductor device according to the second implementation of the disclosed technology.

Figure 4A:
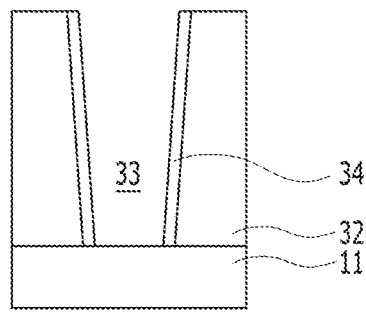
FIGS. 4A to 4F are cross-sectional views illustrating processes of a method for fabricating the semiconductor device according to the second implementation of the disclosed technology.

As shown in FIG. 4A, an interlayer insulating layer 32 may be formed on a first conductive layer 31. The first conductive layer 31 may include a semiconductor substrate. The interlayer insulating layer 32 may include a material having etch selectivity with respect to the first conductive layer 31. The interlayer insulating layer 32 may include a dielectric material, for example, oxide, nitride or oxynitride.

Next, a contact hole 33 may be formed through the interlayer insulating layer 32 so as to expose the first conductive layer 31.

Then, a spacer layer 34 may be formed on both sidewalls of the contact hole 33. The spacer layer 34 may be formed through a series of processes which include forming a dielectric material layer along the entire surface including the contact hole 33 and then etching the dielectric material layer so as to remain only on both sidewalls of the contact hole 33. The spacer layer 34 serves to insulate a contact plug to be formed by a subsequent process, and may be omitted if necessary. The spacer layer 34 may include a material having etch selectivity with respect to the interlayer insulating layer 32 and the contact plug to be formed by a subsequent process. The spacer layer 34 may include a dielectric material, for example, oxide or nitride.

Figure 4B:
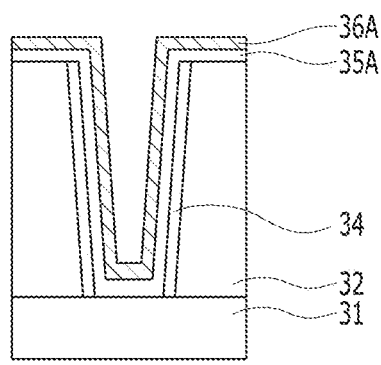

As shown in FIG. 4B, a barrier layer 35A may be formed on the spacer layer 34 along the sidewall and bottom of the contact hole 33. The barrier layer 35A may serve as a barrier to prevent metal ions in the low-resistance material layer 36A from diffusing to the outside. The barrier layer 35A may include an electrically conductive material or compound, for example, tantalum (Ta) or tantalum nitride (TaN), which has the property of preventing the penetration of metal ions.

Next, a low-resistance material layer 36A may be formed on the barrier layer 35A. The low-resistance material layer 36A may be formed as a liner-type layer in order to prevent deterioration (e.g., dishing or deterioration) from occurring in a subsequent planarization process or heat treatment. The low-resistance material layer 36A may include a low-resistance metal material, for example, copper (Cu), tungsten (W), silver (Ag), platinum (Pt) or gold (Au).

Figure 4C:
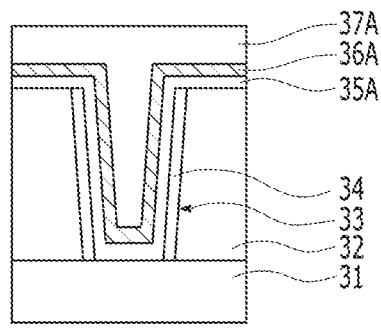

As shown in FIG. 4C, a gap-fill layer 37A may be formed on the low-resistance material layer 36A. The gap-fill layer 37A may include a material that minimizes dishing in a polishing process for planarization, etc. The gap-fill layer 37A may include a metal material, for example, titanium nitride (TiN) or tantalum (Ta). The gap-fill layer 37A may be formed to a thickness that sufficiently fills the contact hole 33.

Figure 4D:
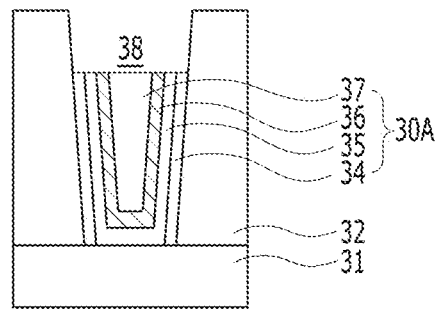

As shown in FIG. 4D, the gap-fill layer 37A (see FIG. 4C), the low-resistance material layer 36A and the barrier layer 35A may be etched to thereby form a low-resistance structure 30A filling a portion of the contact hole 33. The gap-fill layer 37A (see FIG. 4C), the low-resistance material layer 36A and the barrier layer 35A may be subjected to two divided processes: a planarization process which is performed until the interlayer insulating layer 32 is exposed; and an etching process which is performed so as to fill only a portion of the contact hole 33. The low-resistance structure 30A may include the spacer layer 34, the barrier layer 35, the low-resistance material layer 36, and the gap-fill layer 37. This implementation illustrates that the spacer layer 34 is also etched, but if necessary, the spacer layer 34 may not be etched and may remain on the sidewall of the contact hole 33.

As a result, an open portion 38 may be formed on the low-resistance structure 30A.

Figure 4E:
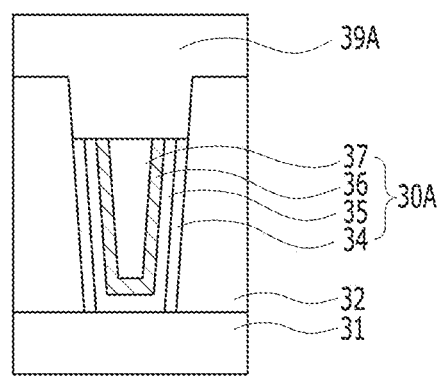

As shown in FIG. 4E, a conductive planarizing layer 39A may be formed in the open portion 38. The planarizing layer 39A may serve not only as a barrier layer that prevents metal ions in the low-resistance material layer 37 from diffusing to an overlying layer that is above the planarizing layer 39A, but also to planarize the surface of the contact plug 30 to thereby prevent the characteristics of the overlying structure from being deteriorated due to surface roughness. The planarizing layer 39A may include a metal material, for example, tantalum (Ta). The planarizing layer 39A may be formed to a thickness that sufficiently fills the open portion 38.

Figure 4F:
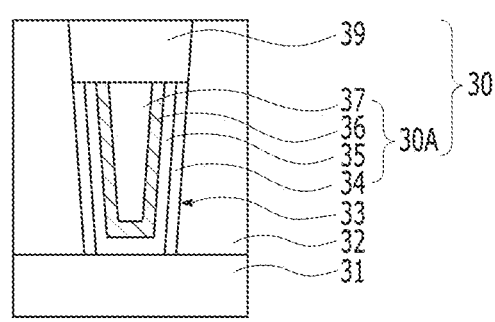

As shown in FIG. 4F, the planarizing layer 39A (see FIG. 4E) may be etched until the interlayer insulating layer 32 is exposed. Etching of the planarizing layer 39A may be performed by a planarization process such as a chemical mechanical polishing process.

As a result, a contact plug 30 composed of the low-resistance structure 30A and the planarizing layer 39 may be formed.

Figure 5:
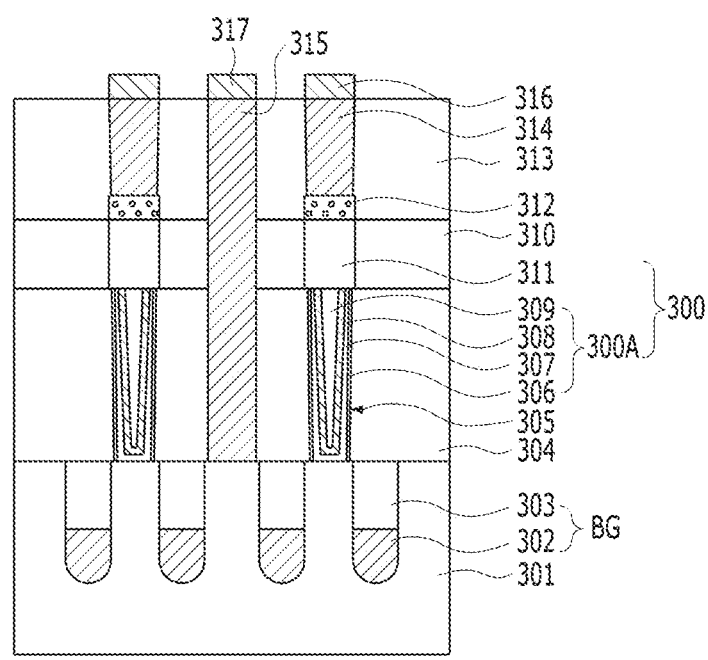
FIG. 5 is a cross-sectional view illustrating an electronic element including a variable resistance element according to the first implementation of the disclosed technology.

FIG. 5 is a cross-sectional view illustrating an electronic element including a variable resistance element according to the first implementation of the disclosed technology.

As shown in FIG. 5, the semiconductor device according to this implementation may include: a substrate 301 including a switching element BG; a first interlayer insulating layer 304 and second interlayer insulating layer 310 formed on the substrate 301; and a bottom electrode contact 300 formed through the first and second interlayer insulating layers 304 and 310 so as to come in contact with the substrate 301. In addition, the semiconductor device may include: a variable resistance pattern 312 formed on the bottom electrode contact 300; a third interlayer insulating layer 313 formed on the second interlayer insulating layer 310 and filling between the variable resistance patterns 312; a metal line 316 formed on the third interlayer insulating layer 313; and a top electrode contact 314 that electrically connects between the variable resistance pattern 312 and the first conductive line 316. Further, the semiconductor device may include a source line contact 315 formed through the first to third interlayer insulating layers 304, 310 and 313 between the variable resistance patterns 312 so as to come in contact with the substrate 301, and a second conductive line 317 formed on the source line contact 315.

Particularly, according to this implementation, the bottom electrode contact 300 includes a stack of the conductive low-resistance structure 300A and the conductive planarizing layer 311, and thus the resistance of the bottom electrode contact 300 can be reduced, and the characteristics of the variable resistance patterns 312 can be prevented from being deteriorated due to surface roughness. This implementation illustrates that the bottom contact electrode 300 include a stack of the low-resistance structure 300A and the planarizing layer 311, which are formed through the first and second interlayer insulating layers 304 and 310; however, as shown in FIG. 2, a stack of the low-resistance structure and the planarizing layer may also be formed on a single interlayer insulating layer. In addition, if necessary, this implementation may also be applied to contact plugs other than the bottom contact plug 300.

The substrate 301 may include a semiconductor substrate. In addition, the substrate 301 may be, for example, a wafer having formed therein a structure such as a buried gate. Herein, the surface of the substrate 301, which comes in contact with the conductive bottom electrode contact 300, may provide a gate layer.

The first to third interlayer insulating layers 304, 310 and 313 may include a dielectric material, for example, oxide, nitride or oxynitride. This implementation illustrates the first to third interlayer insulating layers 304, 310 and 313, but is not limited thereto, and an air gap or the like may be provided instead of the first to third interlayer insulating layers 304, 310 and 313.

The low-resistance structure 300A may include: a spacer layer 306 formed on both sidewalls of a contact hole 305; a liner-type barrier layer 307 formed on the spacer layer 306 along the sidewall and bottom of the contact hole 305; a liner-type low-resistance material layer 308 formed on the barrier layer 307; and a gap-fill layer 309 formed on the low-resistance material layer 308 and filling the remaining portion of the contact hole 305. Namely, the barrier layer 307 and the low-resistance material layer 308 may be formed as U-shaped liner type layers. In addition, the gap-fill layer 309 may have a shape surrounded by the U-shaped low-resistance material layer 307.

The spacer layer 306 may include a dielectric material, for example, oxide or nitride. The spacer layer 306 may optionally be formed or may be omitted. The barrier layer 307 serves as a diffusion barrier for the low-resistance material layer 308, and may include an electrically conductive material. The barrier layer 307 may include a low-resistance conductive material or compound, for example, tantalum (Ta) or tantalum nitride (TaN), which has the property of preventing the penetration of metal ions. The low-resistance material layer 308 serves to reduce the resistance of the contact plug, and may be formed as a liner-type layer. The low-resistance material layer 308 may include one or more low-resistance material materials, for example, copper (Cu), tungsten (W), silver (Ag), platinum (Pt) and/or gold (Au). The gap-fill layer 309 may include a material that minimizes dishing in a polishing process for planarization, etc. For example, the gap-fill layer 309 may include a metal material such as titanium nitride (TiN) or tantalum (Ta).

The planarizing layer 311 may serve not only as a barrier layer that prevents metal ions in the low-resistance material layer 308 from diffusing to an overlying layer that is above the planarizing layer 311, but also to planarize the surface of the bottom electrode contact 300 to thereby prevent the characteristics of the overlying structure from being deteriorated due to surface roughness. The planarizing layer 311 for this purpose may include a metal material, for example, tantalum (Ta).

As described above, the low-resistance structure 300A according to this implementation includes not only the low-resistance material layer 308 for reducing the resistance of the bottom electrode contact 300, but also the liner-type gap-fill layer 309 formed of a low-resistance material such as copper (Cu), and thus it can prevent dishing or heat-induced migration in a subsequent planarization process and, at the same time, ensure low resistance. In addition, the planarizing layer 311 can prevent metal ions in the low-resistance structure 300A from diffusing to the overlying structure (not shown) and, at the same time, planarize the surface of the bottom electrode contact to thereby prevent the characteristics of the overlying structure from being deteriorated due to surface roughness.

FIGS. 6A to 6D are cross-sectional views illustrating processes of a method for fabricating the electronic device according to the first implementation of the disclosed technology.

Figure 6A:
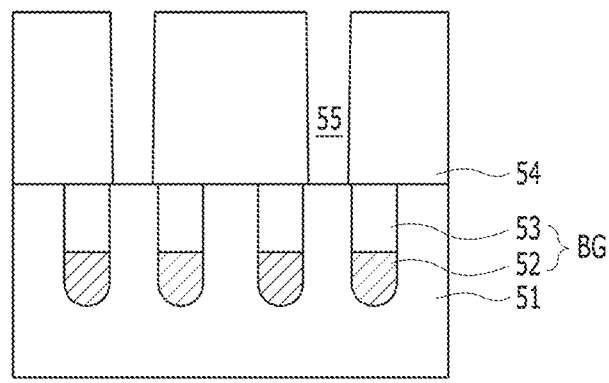
FIGS. 6A to 6D are cross-sectional views illustrating processes of a method for fabricating the electronic device according to the first implementation of the disclosed technology.

As shown in FIG. 6A, a switching element BG may be formed in a substrate 51. The substrate 51 may include a semiconductor substrate.

The switching element BG may include a buried gate, but is not limited thereto. The switching element BG may be formed by etching the substrate 51 to form a trench (not shown) and depositing a metal gate 52 and a sealing layer 53 in the trench. The metal gate 52 may include an electrically conductive material, and the sealing layer 53 may include a dielectric material, for example, nitride.

The switching element BG serves to select a certain unit cell in a semiconductor device including a plurality of unit cells, and may include a transistor, a diode or the like. One end of the switching element BG may be electrically connected to the bottom electrode contact to be formed by a subsequent process, and the other end may be electrically connected with a source line contact.

Next, a first interlayer insulating layer 54 including a contact hole 55 may be formed on the substrate 51 including the switching element BG. The first interlayer insulating layer 54 may include a dielectric material, for example, oxide, nitride or oxynitride. The contact hole 55 may be formed through the first interlayer insulating layer 54 so as to expose a portion of the substrate 51 between the switching elements BG.

Figure 6B:
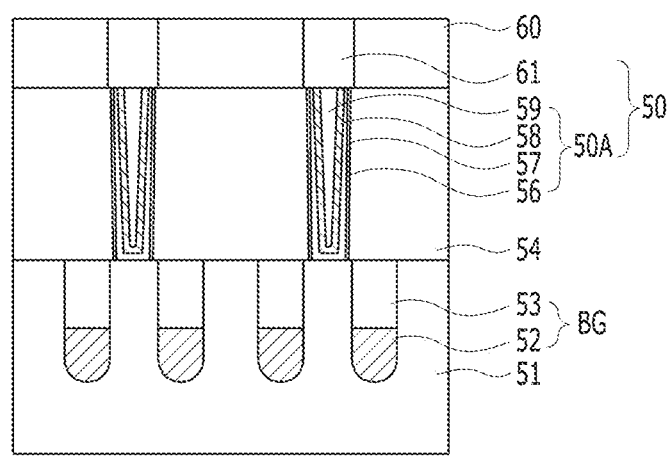

As shown in FIG. 6B, a conductive low-resistance structure 50A filling the contact hole 55 (see FIG. 6A) may be formed.

The low-resistance structure 50A may include: a spacer layer 56 formed on both sidewalls of the contact hole 55; a liner-type barrier layer 57 formed on the spacer layer 56 along the sidewall and bottom of the spacer layer 56; a liner-type low-resistance material layer 58 formed on the barrier layer 57; and a gap-fill layer 59 formed on the low-resistance material layer 58 and filling the remaining portion of the contact hole 55.

The spacer layer 56 may include a dielectric material, for example, oxide or nitride. The spacer layer 56 may optionally be formed or may be omitted. The barrier layer 57 may serve as a diffusion barrier for the low-resistance material layer 58, and may include an electrically conductive material. Namely, the barrier layer 57 may serve as a diffusion barrier layer. The barrier layer 57 may include a low-resistance conductive material or compound, for example, tantalum (Ta) or tantalum nitride (TaN), which has the property of preventing the penetration of metal ions. The low-resistance material layer 58 serves to reduce the resistance of the contact plug, and may be formed as a liner-type layer. The low-resistance material layer 58 may include one or more low-resistance metal materials, for example, copper (Cu), tungsten (W), silver (Ag), platinum (Pt) and/or gold (Au). The gap-fill layer 59 may include a material that minimizes dishing in a polishing process for planarization, etc. For example, the gap-fill layer 59 may include a metal layer such as titanium nitride (TiN) or tantalum (Ta).

Next, a second interlayer insulating layer 60 may be formed on the first interlayer insulating layer 54 including the low-resistance structure 50A.

Thereafter, a conductive planarizing layer 61 may be formed through the second interlayer insulating layer 60 so as to come in contact with the low-resistance structure 50A.

The planarizing layer 61 may serve not only as a barrier layer that prevents metal ions in the low-resistance material layer 58 from diffusing to an overlying layer that is above the planarizing layer 61, but also to planarize the surface of the bottom electrode contact 50 to thereby prevent the characteristics of the overlying structure from being deteriorated due to surface roughness. The planarizing layer 61 for this purpose may include a metal material, for example, tantalum (Ta).

The low-resistance structure 50A and the planarizing layer 61 may serve as the bottom electrode contact 50 for variable resistance patterns to be formed by a subsequent process. In this implementation, the low-resistance structure 50A and the planarizing layer 61 may be formed through a series of processes as shown in FIGS. 3A to 3G or FIGS. 4A to 4F.

Figure 6C:
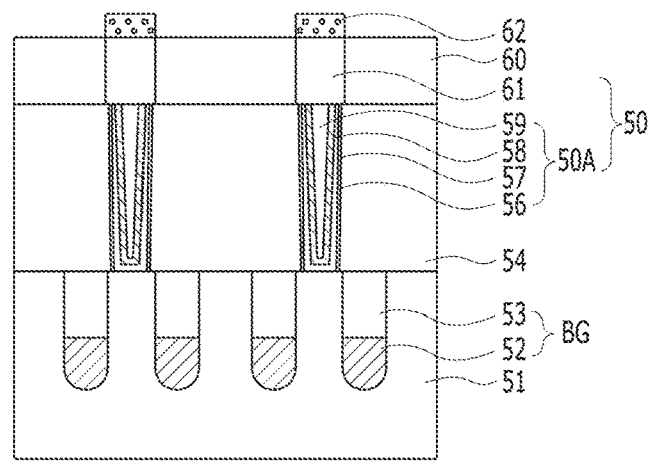

As shown in FIG. 6C, variable resistance patterns 62 may be formed on or over the planarizing layer 61. The variable resistance pattern 62 may include a material having the property of switching between different resistance states according to a voltage or current applied to both ends. For example, the variable resistance pattern 62 may include various materials that are used in RRAM, PRAM, FRAM, MRAM and the like, for example, metal oxides such as transition metal oxides or perovskite-based materials, phase-change materials such as chalcogenide-based materials, ferroelectric materials, ferromagnetic materials, etc. The variable resistance pattern 62 may have a single-layer structure or a multilayer structure including a combination of two or more layers, which shows variable resistance characteristics.

For example, the variable resistance pattern 62 may include a magnetic tunnel junction (MJT) structure including two magnetic layers and a tunnel barrier layer sandwiched between the magnetic layers. Each of the magnetic layers may have a single-layer or multilayer structure including various ferromagnetic materials, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, etc. Any one of two magnetic layers may have a changeable magnetization direction, and thus function as a free layer or a storage layer, and the other one may have a pinned magnetization direction, and thus function as a pinned layer or a reference layer. The tunnel barrier layer allows the tunneling of electrons, making it possible to change the magnetization direction of the free layer. The tunnel barrier may have a single-layer or multi-layer structure including an oxide, for example, $Al_2O_3$, MgO, CaO, SrO, TiO, VO, NbO or the like.

If the magnetization directions of the two magnetic layers in this variable resistance pattern 62 are parallel to each other, the variable resistance pattern may be in a low-resistance state and may store, for example, data '0'. On the contrary, if the magnetization directions of the two magnetic layers are antiparallel to each other, the variable resistance pattern may be in a high-resistance state and may store, for example, data '1'. The variable resistance pattern 62 may further include, in addition to the MTJ structure, various layers for ensuring the characteristics of the MTJ structure.

In another example, the variable resistance pattern 62 may include a metal oxide which includes oxygen vacancies and whose resistance can be changed by the behavior of the oxygen vacancies.

Particularly, in this implementation, the bottom electrode contact 50 for the variable resistance pattern 62 is composed of a stack of the low-resistance structure 50A and the planarizing layer 61, and thus the contact resistance can be reduced and the planarization of the bottom electrode contact can be induced, thereby preventing the characteristics of the variable resistance pattern 62 from being deteriorated due to surface roughness. In addition, even though the low-resistance structure 50A includes the low-resistance material layer 58 made of, for example, copper (Cu), the planarizing layer 61 formed on the low-resistance structure 50A can prevent copper ions from diffusing to the variable resistance pattern 62, thereby preventing the characteristics of the variable resistance pattern 62 from being deteriorated due to the diffusion of metal ions.

Figure 6D:
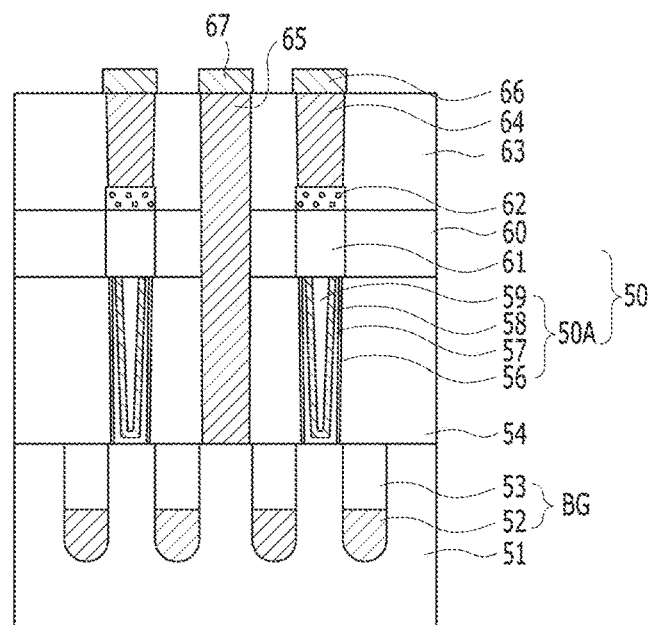

As shown in FIG. 6D, a third interlayer insulating layer 63 may be formed on the second interlayer insulating layer 60 so as to fill between the variable resistance patterns 62. The third interlayer insulating layer 63 may be formed to a thickness that sufficiently fills between the variable resistance patterns 62. The third interlayer insulating layer 63 may include a dielectric material such as oxide, nitride or oxynitride.

Next, a top electrode contact 64 may be formed through the third interlayer insulating layer 63 so as to be electrically connected to the variable resistance pattern 62. The top electrode contact 64 may be formed through a series of processes which includes etching the third interlayer insulating layer 63 to form a contact hole that exposes the top surface of the variable resistance pattern 62, filling an electrically conductive material layer in the contact hole, and then etching the conductive material layer so as to expose the third interlayer insulating layer 63. The top electrode contact 64 may serve not only to electrically connect the variable resistance pattern 62 and a first conductive line 66 to be formed by a subsequent process, but also as a top electrode for the variable resistance pattern 62.

Thereafter, a source line contact 65 may be formed through the first to third interlayer insulating layers 63, 60 and 52 between the variable resistance patterns so as to come in contact with the substrate 51. The source line contact 65 may be formed to have a single-layer or multi-layer structure. This implementation illustrates that the source line contact 65 is formed after formation of all the top electrode contacts, but is not limited thereto, the order of processes, the stack structure, etc., may, if necessary, be changed in various ways.

Next, first and second conductive lines 66 and 67 may be formed on the third interlayer insulating layer 63. The first conductive line 66 is configured to apply a voltage or current to the variable resistance pattern 62, and the second conductive line 67 is configured to apply a voltage or current to the substrate 51 through the source line contact 65. The first and second conductive lines 66 and 67 may be formed as line types. The first and second conductive lines 66 and 67 may include conductive materials. This implementation illustrates that the first and second conductive lines 66 and 67 are formed at the same levels, but is not limited thereto, and the order of processes or the step height, etc., may, if necessary, be changed in various ways.

According to the electronic devices including the semiconductor memory and the fabrication method thereof as described above, processes for fabricating the electronic device can be easily performed, and the characteristics of the variable resistance element can be improved.

The above and other memory circuits or semiconductor devices based on the disclosed technology can be used in a range of devices or systems. FIGS. 7-11 provide some examples of devices or systems that can implement the memory circuits disclosed herein.

Figure 7:
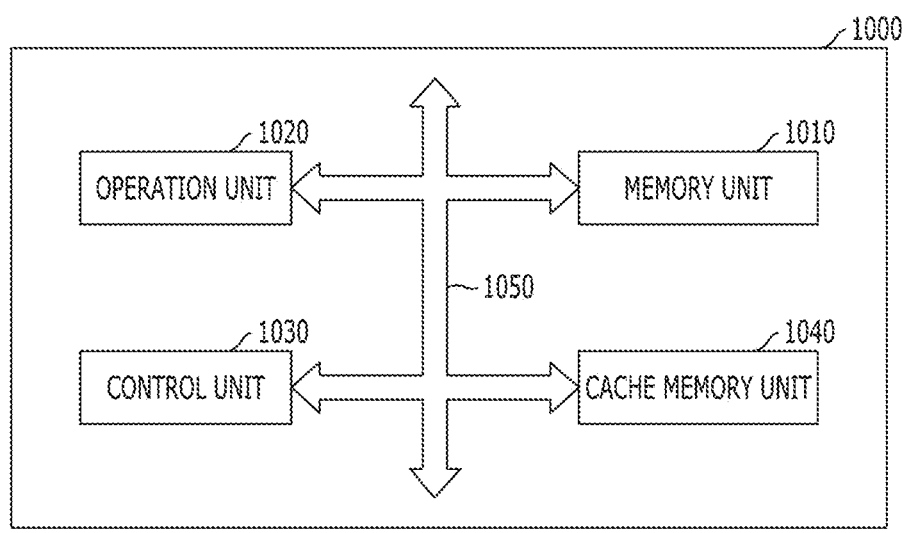
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the memory unit 1010 may be improved and fabricating processes of the memory unit 1010 may be easy. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
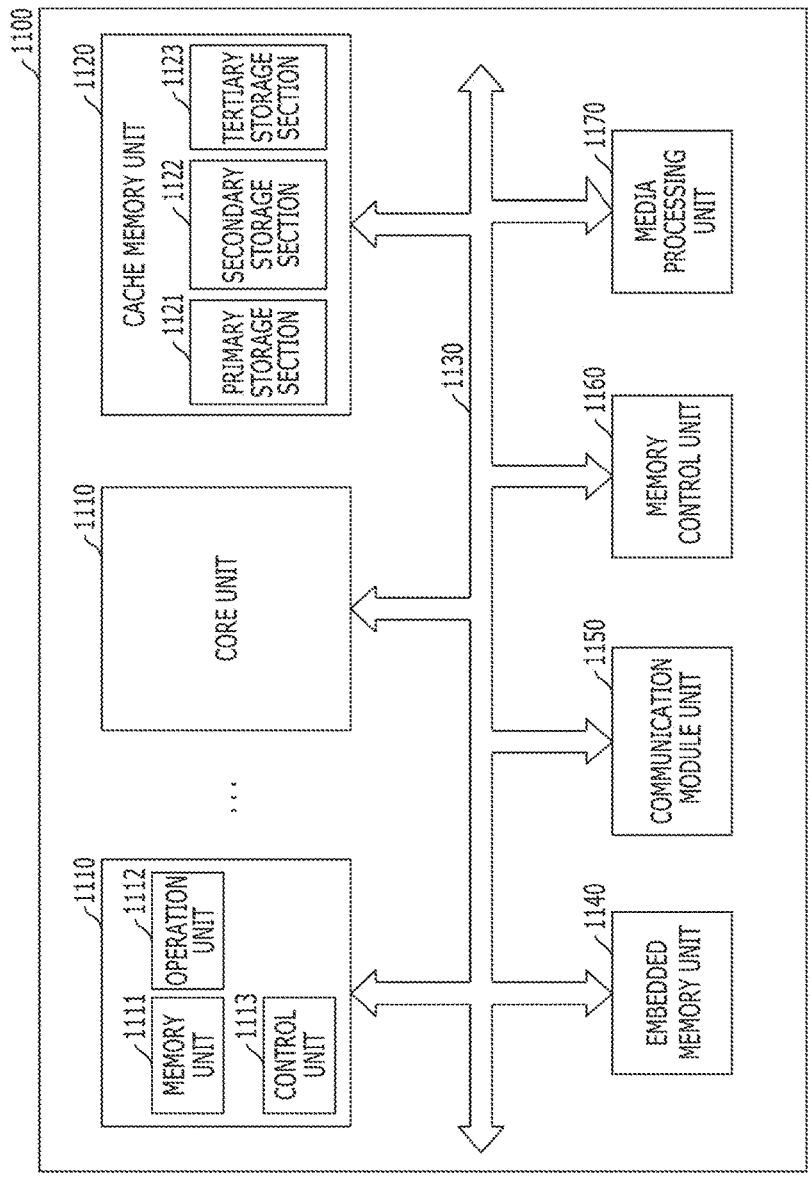
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the cache memory unit 1120 may be improved and fabricating processes of the cache memory unit 1120 may be easy. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit

1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
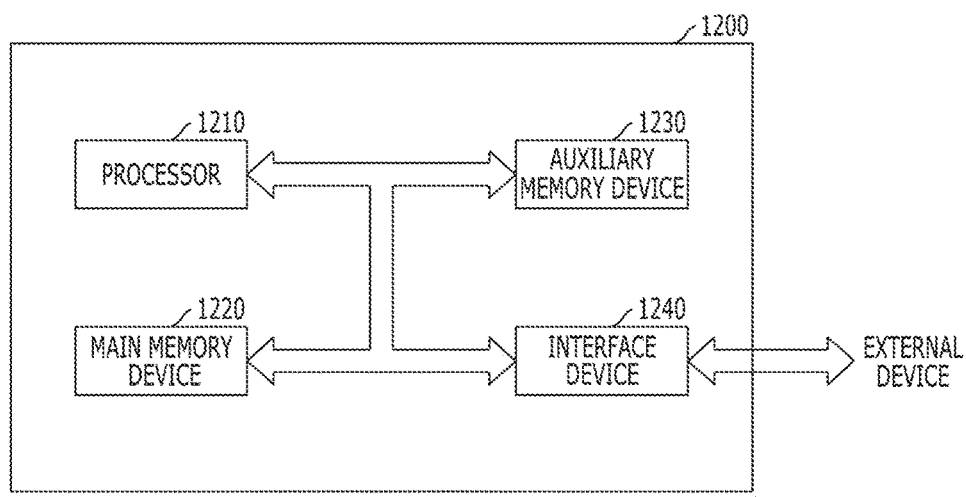
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the main memory device 1220 may be improved and fabricating processes of the main memory device 1220 may be easy. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the auxiliary memory device 1230 may be improved and fabricating processes of the auxiliary memory device 1230 may be easy. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
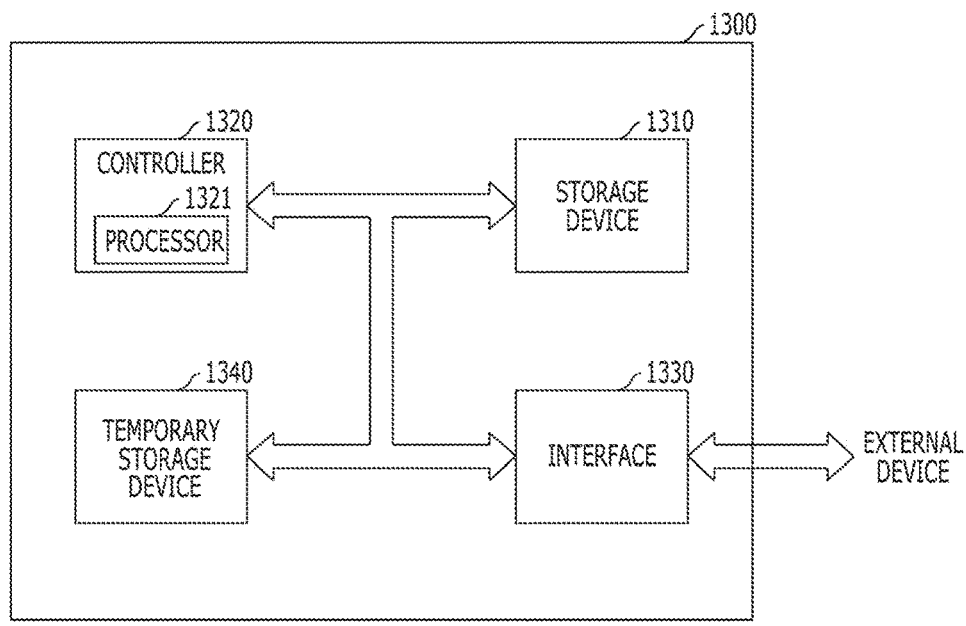
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the temporary storage device 1340 may be improved and fabricating processes of the temporary storage device may be easy. As a consequence, operating characteristics and data storage characteristics of the data storage system 1300 may be improved.

Figure 11:
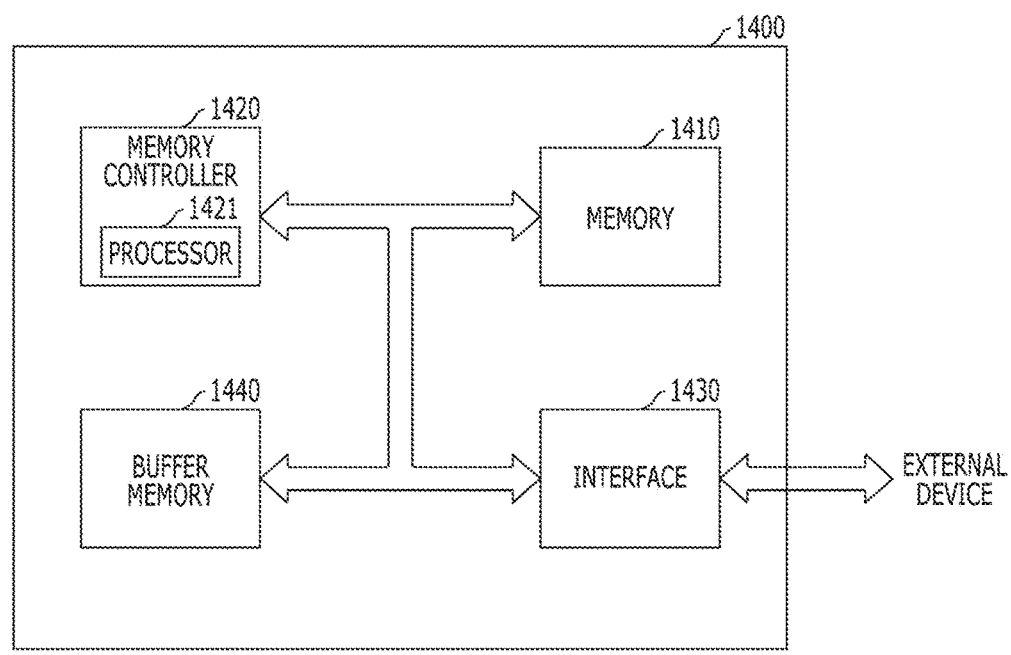
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the memory 1410 may be improved and fabricating processes of the memory 1410 may be easy. As a consequence, operating characteristics and memory characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate; a conductive contact plug formed over the first conductive layer and comprising a stack of a conductive low-resistance structure and a conductive planarizing layer; and a variable resistance pattern coupled to the contact plug, wherein the low-resistance structure comprises a diffusion barrier layer, a low-resistance material layer, and a gap-fill layer. Through this, data storage characteristics of the buffer memory 1440 may be improved and fabricating processes of the buffer memory 1440 may be easy. As a consequence, operating characteristics and memory characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a conductive layer;
   an interlayer insulating layer disposed over the conductive layer;
   a contact hole formed through the interlayer insulating layer to expose a surface of the conductive layer;
   an insulating spacer formed on an inner sidewall of the contact hole;
   a conductive contact plug formed in the contact hole, the conductive contact plug including a conductive low-resistance structure and a conductive planarizing layer; and
   a variable resistance pattern coupled to the contact plug, the variable resistance pattern exhibiting different resistance states for storing information;
   wherein the low-resistance structure comprises a diffusion barrier layer, a low-resistance material layer, and a gap-fill layer,
   wherein the diffusion barrier layer and the low-resistance material layer are U-shaped liner-type layers, and
   wherein the insulating spacer is disposed on sidewalls of the diffusion barrier layer and is not disposed on a bottom of the diffusion barrier layer.

2. The electronic device of claim 1, wherein the diffusion barrier layer comprises a tantalum layer or a tantalum nitride layer.

3. The electronic device of claim 1, wherein the low-resistance material layer comprises a metal material selected from copper, tungsten, silver, platinum or gold.

4. The electronic device of claim 3, wherein the low-resistance material layer has an electrical conductivity of at least 9 Msm−1.

5. The electronic device of claim 1, wherein the gap-fill layer comprises a titanium nitride layer or a tantalum layer.

6. The electronic device of claim 1, wherein the planarizing layer comprises a tantalum layer.

7. The electronic device of claim 1, further comprising an interlayer insulating layer formed over the substrate, wherein the contact plug is formed through the interlayer insulating layer.

8. The electronic device of claim 1, wherein the variable resistance pattern comprises two magnetic layers and a tunnel barrier layer sandwiched between the magnetic layers.

9. The electronic device of claim 1, wherein the variable resistance pattern comprises a stack of first and second metal oxide layers having different oxygen contents.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

11. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

12. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and an outside,
    wherein the semiconductor memory is part of the auxiliary memory device or the main memory device in the processing system.

13. The electronic device according to claim 1, further comprising a data storage system which includes:
    a storage device configured to store data and conserve stored data regardless of power supply;
    a controller configured to control input and output of data to and from the storage device according to a command inputted form an outside;
    a temporary storage device configured to temporarily store data exchanged between the storage device and the outside; and
    an interface configured to perform communication between at least one of the storage device, the controller and the temporary storage device and the outside, wherein the semiconductor memory is part of the storage device or the temporary storage device in the data storage system.

14. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

15. An electronic device comprising a semiconductor memory, wherein the semiconductor memory comprises:
   a conductive layer;
   an interlayer insulating layer disposed on the conductive layer;
   a conductive contact plug disposed on the conductive layer and through the interlayer insulating layer, the conductive contact plug comprising a conductive low-resistance structure and a conductive planarizing layer;
   a variable resistance pattern on the conductive planarizing layer,
   a contact hole disposed through the interlayer insulating layer to expose a surface of the conductive layer; and
   an insulating spacer formed on inner sidewalls of the contact hole,
   wherein the conductive contact plug is formed in the contact hole,
   wherein sidewalls of the conductive low-resistance structure are surrounded by the spacer,
   wherein a bottom of the conductive low-resistance structure is coupled to the exposed surface of the conductive layer, and
   wherein the conductive low-resistance structure comprises a diffusion barrier layer including Ta, a low-resistance material layer including Cu, and a gap-fill layer including one of Ta or TiN.

16. The electronic device according to claim 15,
   wherein sectional views of the diffusion barrier layer and the low-resistance material layer are U-shaped, and
   wherein a bottom of the diffusion barrier layer is not surrounded by the insulating spacer.

17. An electronic device comprising a semiconductor memory, wherein the semiconductor memory comprises:
   a conductive layer;
   an interlayer insulating layer disposed on the conductive layer;
   a contact hole disposed though the interlayer insulating layer to expose a surface of the conductive layer;
   an insulating spacer disposed on an inner sidewall of the contact hole to expose the surface of the conductive layer;
   a conductive low-resistance structure disposed in the contact hole;
   a conductive planarizing layer disposed on the conductive-low resistance structure; and
   a variable resistance pattern disposed on the conductive planarizing layer,
   wherein the conductive low-resistance structure comprises a diffusion barrier layer, a low-resistance material layer on the diffusion barrier layer, and a gap-fill layer, the diffusion barrier layer in contact with the exposed conductive layer and the insulating spacer,
   wherein an electrical conductivity of the low-resistance material layer is greater than an electrical conductivity of the gap-fill layer.

18. The electronic device according to claim 17, wherein:
   the insulating spacer includes a silicon nitride,
   the diffusion barrier layer includes one of Ta or TaN,
   the low-resistance material layer includes Cu,
   the gap-fill layer includes one of TiN or Ta
   the conductive planarizing layer includes Ta.

* * * * *